US007435633B2

(12) United States Patent
Todorokihara et al.

(10) Patent No.: US 7,435,633 B2
(45) Date of Patent: Oct. 14, 2008

(54) ELECTROLUMINESCENCE DEVICE, MANUFACTURING METHOD THEREOF, AND ELECTRONIC APPARATUS

(75) Inventors: Masayoshi Todorokihara, Suwa-gun (JP); Kazuyuki Miyashita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 83 days.

(21) Appl. No.: 11/680,972

(22) Filed: Mar. 1, 2007

(65) Prior Publication Data

US 2007/0215871 A1 Sep. 20, 2007

(30) Foreign Application Priority Data

Mar. 14, 2006 (JP) .............. 2006-069827

(51) Int. Cl.
*H01L 21/00* (2006.01)
(52) U.S. Cl. .............. 438/149; 438/99; 438/152; 438/238; 257/79; 257/E21.094; 257/E21.104
(58) Field of Classification Search ......... 257/E21.053, 257/E21.094, E21.104, E21.352, E21.366, 257/E21.372, E21.457
See application file for complete search history.

(56) References Cited

U.S. PATENT DOCUMENTS

2006/0102900 A1* 5/2006 Shin et al. .............. 257/59

2007/0026583 A1* 2/2007 Ikeda et al. .............. 438/149

FOREIGN PATENT DOCUMENTS

JP   A 2002-189429   7/2002

* cited by examiner

*Primary Examiner*—Scott B. Geyer
*Assistant Examiner*—Cheung Lee
(74) *Attorney, Agent, or Firm*—Oliff & Berridge, PLC

(57) ABSTRACT

An organic electroluminescence device including: a substrate having conductivity on at least one side; a first insulation film, formed on one side of the substrate, while having an aperture which partially exposes the same side of the substrate; a semiconductor film, formed on the first insulation film, while covering a part of the first insulation film; a second insulation film formed on the first insulation film, while covering the semiconductor film and contacting the same side of the substrate via the aperture; a capacitor electrode, formed on the aperture, while sandwiching the second insulation film so as to face the substrate; a gate electrode formed on the semiconductor film, so as to sandwich the second insulation film; and an organic electroluminescence element, formed on the second insulation film, electrically connected to the semiconductor film.

11 Claims, 13 Drawing Sheets

ELECTROLUMINESCENCE DEVICE, MANUFACTURING METHOD THEREOF, AND ELECTRONIC APPARATUS

BACKGROUND

1. Technical Field

Several aspects of the present invention relate to an organic electroluminescence device having a plurality of organic electroluminescence (hereafter referred to as "EL") elements formed on a substrate, the manufacturing method thereof, and an electronic apparatus including the organic EL device.

2. Related Art

The organic EL device includes, as its main components a circuit element substrate and organic EL elements. This circuit element substrate includes a substrate such as glass substrates, wirings formed thereon, and pixel circuits connected to those wirings. Those wirings include, for instance, a plurality of scanning lines, and a plurality of signal lines and power lines that are aligned to cross these scanning lines. Here, the power lines supply electric power to the organic EL elements. The pixel circuits are arranged at the crossing points of the scanning lines and the signal lines. Each pixel circuit functions in a manner that the organic EL element emits light by impressing a voltage between the power source and the electrode of the organic EL element (another or cathode). A transistor included in the pixel circuit is connected serially to the organic EL element at a location between the power source and the organic El, element. This transistor adjusts the current supplied to the organic EL element, thereby causing the organic EL element to emit light in a desired luminance.

In the above-referenced organic EL devices, storage capacitors that store the voltage applied to the transistors are commonly included in the pixel circuits. An example of the methods for forming such storage capacitors is disclosed in JP A-2002-189429. This example discloses a semiconductor device including: a substrate having a metallic surface; an insulation film formed on the substrate which has the metallic surface; a pixel unit formed on the insulation film; wherein the pixel unit includes thin film transistors (TFTs) and a wiring that connects the TFTs; and wherein a storage capacitor is formed including the insulation film the wiring, and the substrate having a metallic surface.

The above example also cites methods for increasing the storage capacitance, such as: making a thin insulation film that functions as dielectrics; and providing a large region (area) for forming the storage capacitance. However, the region in which the capacitor can be formed is limited to the area surrounded by the scanning line (gate wiring) and the signal line (source wirings). Therefore, the effective way to increase the capacitance is to make the thickness of the insulation film thin. On the other hand, a considerable parasitic capacitance is generated between the conductive substrate and the wirings when the thickness of the insulation film is small. In order to avoid an increase of a parasitic capacitance, it is desirable to thicken the insulation film that is provided between the substrate and the components such as wirings. Consequently, fulfilling the two contradicting requirements, which is to increase the storage capacitance and to decrease the parasitic capacitance, is difficult.

SUMMARY

An advantage of the invention is to provide: an organic EL device that satisfies both requirements of increasing the storage capacitance and decreasing the parasitic capacitance; and a manufacturing method of the organic EL device.

According to a first aspect of the invention, an organic electroluminescence device includes: a substrate having conductivity on at least one side; a first insulation film, formed on one side of the substrate, while having an aperture which partially exposes the same side of the substrate; a semiconductor film, formed on the first insulation film, while covering a part of the first insulation film; a second insulation film formed on the first insulation film, while covering the semiconductor film and contacting the same side of the substrate via the aperture; a capacitor electrode, formed on the aperture, while sandwiching the second insulation film so as to face the substrate; a gate electrode formed on the semiconductor film, so as to sandwich the second insulation film; and an organic electroluminescence element, formed on the second insulation film, electrically connected to the semiconductor film.

According to a second aspect of the invention, an organic electroluminescence device includes: a substrate having conductivity on at least one side; a first insulation film, formed on one side of the substrate, while having an aperture which partially exposes the same side of the substrate; a gate electrode, formed on the first insulation film, while covering a part of the first insulation film; a second insulation film formed on the first insulation film, while covering the gate electrode and contacting the same side of the substrate via the aperture; a capacitor electrode, formed on the aperture, while sandwiching the second insulation film so as to face the substrate; a semiconductor film formed on the gate electrode, so as to sandwich the second insulation film; and an organic electroluminescence element, formed on the second insulation film, electrically connected to the semiconductor film.

According to the above aspects of the invention, combining the first insulation film and the second insulation film allows a separation of functions required in insulation films. In other words, conditions such as film thickness or permittivity, suitable for reducing the parasitic capacitance, can be set for the first insulation film, while assuring the insulation between the substrate and the organic electroluminescence elements or the transistors installed on this substrate. Moreover, conditions such as film thickness or permittivity, suitable for increasing an electrostatic capacitance, can be set for the second insulation film, when forming capacitive elements being sandwiched by the conductive substrate and the capacitor electrode. Consequently, the increase of the storage capacitance increase of the capacitive elements, and the decrease of the parasitic capacitance generated between the substrate and the circuit component, are simultaneously obtained.

In the above aspects, it is preferable that the film thickness of the second insulation film be smaller than that of the first insulation film. Moreover, it is preferable that the permittivity of the second insulation film be larger than that of the first insulation film.

This allows an increase of the electrostatic capacitance of the capacitive element, while adequately assuring the insulating property between the conductive substrate and at least one of the transistor and the organic EL element.

According to the above aspects of the invention, the above-described substrate includes a conductive substrate (for instance, a stainless substrate).

Hence, a suitable substrate, according to each aspect of the invention described above, is obtained. The conductive substrate has advantages such as flexibility and mechanical strength.

Insulating substrate with conductive films formed on one side or both sides thereof may also be used as the substrate.

Thus, the suitable substrate, according to each aspect of the invention described above, is obtained, while utilizing insulating substrates such as glass substrates or resin substrates.

According to a third aspect of the invention, a method for manufacturing the organic electroluminescence device according to the first aspect of the invention, includes: forming a first insulation film on a side of a conductive substrate; forming, on the first insulation film, an aperture which partially exposes the side of the substrate; forming, on the first insulation film, a semiconductor substrate which covers a part of the first insulation film; forming, on the first insulation film, a second insulation film covering the semiconductor film and contacting the side of the substrate via the aperture; forming, on the aperture, a capacitor electrode sandwiching the second insulation film so as to face the substrate; forming, on the second insulation film, a gate electrode arranged on the semiconductor film while sandwiching the second insulation film; and forming, on the second insulation film, an organic electroluminescence element electrically connected to the semiconductor film.

The above method can be applied to manufacturing of the organic EL device according to the first aspect of the invention in a suitable manner.

According to a forth aspect of the invention, a method for manufacturing the organic electroluminescence device according to the first aspect of the invention, includes: forming a first insulation film on a side of a conductive substrate; forming, on the first insulation film, an aperture which partially exposes the side of the substrate; forming, on the first insulation film, a gate electrode which covers a part of the first insulation film; forming, on the first insulation film, a second insulation film covering the gate electrode and contacting the side of the substrate via the aperture; forming, on the second insulation film, a semiconductor film arranged on the gate electrode while sandwiching the second insulation film; forming, on the aperture, a capacitor electrode sandwiching the second insulation film so as to face the substrate; and forming, on the second insulation film, an organic electroluminescence element electrically connected to the semiconductor film.

The above method can be applied to manufacturing of the organic EL device according to the second aspect of the invention in a suitable manner.

According to a fifth aspect of the invention, an electronic apparatus includes the organic EL device according to each aspect described above. Specifically the electronic apparatus includes this organic EL device as a display unit of the electronic apparatus. Here, examples of the electronic apparatus are display device, television, electronic paper, clock, calculator, mobile phone, and mobile terminal. It may also include, for instance, an exposure head for exposing a photoreceptor of a printing device, using the organic EL device described above. Here, the organic EL device is used as a light source that generates light for exposure.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will now be described.

Figure 1:
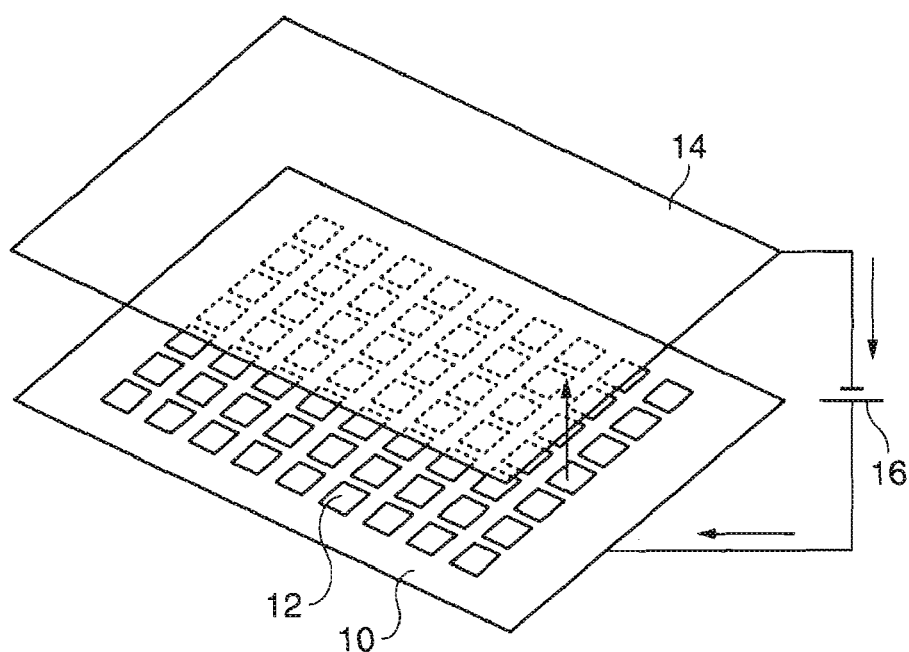
FIG. 1 is a schematic drawing describing a basic structure of an organic EL device.

FIG. 1 is a schematic drawing describing a basic structure of an organic EL device according to each of the embodiments. The organic EL device includes: a substrate 10 having conductivity; a plurality of pixel units 12 formed on one side of the substrate 10; and a common electrode 14 shared by the plurality of pixel units 12. As shown in FIG. 1, a power source 16 is connected between the substrate 10 and the common electrode 14.

As long as conductivity is provided to at least one side of the substrate 10, the substrate 10 may be an insulating substrate, while it is preferable that the substrate 10 be a conductive substrate composed with conductors. Examples of the substrate 10 for the former option above include the ones where a conductive film composed of metals such as aluminum or of indium tin oxide (ITO) is deposited on one side of the insulating substrates such as a glass, a quartz, and ceramic substrates. An example of the substrate 10 for the latter option above includes stainless substrate. This is because the stainless substrate is preferable for the substrate 10, in consideration of the requirements such as heat resistance. The conductive films may also be formed on both sides of the insulation substrate, electrically connecting those two conductive films in order to form the substrate 10. Such substrate functions as an equivalent of the conductive substrate in the embodiments.

Each of the pixel units 12 includes the organic EL element and a drive circuit for driving the organic EL element. The common electrode 14 is shared by each of the organic EL elements of the pixel units 12, and functions as the electrode on one side for each of the organic EL elements, which will be described in details later. The organic EL device according to the embodiments, an electric power is supplied to each of the pixel units 12 through the substrate 10, using the conductivity of the substrate 10.

Figure 2:
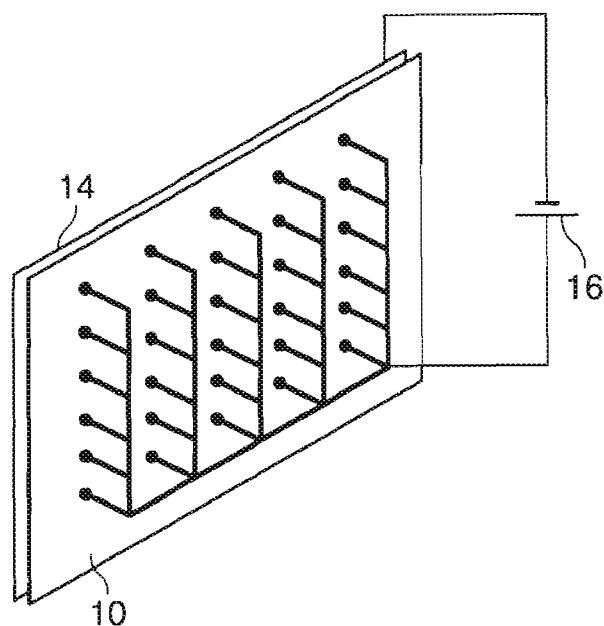
FIG. 2 is a schematic drawing describing the basic structure of the organic EL device.

As shown in FIG. 1, the substrate 10 and the power source 16 are connected at one point of the substrate 10. Here, if the conductivity is provided only to one side of the substrate 10, the power source 16 is connected to this side of the substrate 10. If the substrate 10 is composed with a conductive substrate, the power source 16 may also be connected to the other side of the substrate 10. This widens the choice of the contact point of the power source 16. It is also preferable to have a plurality of contact points between the substrate 10 and the power source 16. For instance, as shown in FIG. 2, the substrate 10 and the power source 16 are connected at a number of points spread across the other side of the substrate 10. As exemplified in FIG. 2, it is preferable that the contact points of the substrate 10 and the power source 16 be spread in a wide range. Moreover, as exemplified in FIG. 2, it is preferable that the plurality of contact points of the substrate 10 and the power source 16 be aligned regularly, for instance, in even intervals. Consequently, a voltage decline on the surface of the substrate 10 is suppressed more effectively. Here, the contact points of the power source 16 to the substrate 10 is either a high potential terminal of the power source 16 or a low potential terminal (generally a ground terminal). In FIGS. 1 and 2, the former case is indicated.

Figure 3:
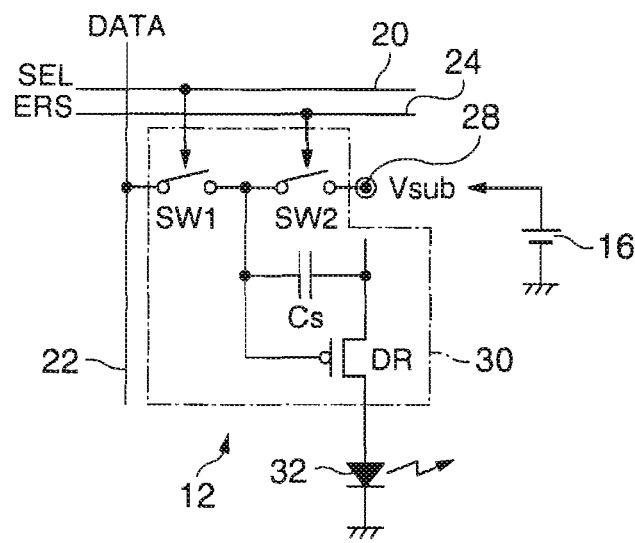
FIG. 3 is a drawing describing an example of a circuitry composition of the organic EL device.

FIG. 3 is a drawing describing an example of the circuitry composition of the organic EL device according to the embodiments. As shown in the figure, the organic EL device includes: a plurality of scanning lines 20 and reset lines 24, both extending in a horizontal direction (a first direction) in the figure; a plurality of signal lines 22 arranged to cross these lines such as scanning lines 20; a plurality of pixel circuits (drive circuits) 30; and a plurality of organic EL elements 32; where both of the pixel circuits 30 and the organic EL elements 32 are arranged on the crossing points of the scanning lines 20 and the signal lines 22. Hereafter, the components described above may also be represented in singular form, such as "the pixel circuit 30, and the organic EL element 32". As shown in the figure, a voltage Vsub is supplied from the power source 16 through the node 28 to the pixel circuit 30. The node 28 is electrically connected to the conductive substrate 10 described above. That is to say, in the embodiments, the substrate 10 functions as a part of the power supply channel. Each of the pixel units 12 described above is formed including the pixel circuit 30 and the organic EL element 32. Hereafter, the pixel units 12 may also be referred to as "pixel unit 12" in a singular form.

The pixel circuit 30 shown in FIG. 3 is formed including a current control transistor DR, a data write-in transistor SW1, a data-deletion transistor SW2, and a storage capacitor Cs. The current control transistor DR is a p-channel type field-effect transistor, with the source thereof connected to the node 28 (the contact point with the substrate 10), and the drain thereof connected to one terminal of the organic EL element 32. The organic EL element 32 installed corresponding to the drive circuit 30 is connected, at one terminal, to the drain of the current control transistor DR, and at its another terminal, to a common ground. The data write-in transistor SW1 is connected to the scanning line 20 at its gate, to the signal line 22 at its source, and to the gate of the current control transistor DR at its drain. The data-deletion transistor SW2 is connected to one of the reset line 24 at its gate, to the drain of the data write-in transistor SW1 at its source, and to one of the nodes 28 at its drain. The storage capacitor Cs is connected in parallel between the gate and the source of the current control transistor DR.

The operation of the pixel circuit 30 shown in FIG. 3 is as follows. Scanning signals SEL are supplied through the scanning line 20, and during the period when the data write-in transistor SW1 is selected data signals DATA are written-in to the gate of the current control transistor DR through the signal line 22. Currents corresponding to the sizes of the data signals DATA are supplied from the power source 16 to the organic EL element 32, through the node 28 and a source-drain channel of the current control transistor DR. This causes light-emissions of the organic EL element 32 in luminance corresponding to the size of the data signals DATA. Reset signals ERS are supplied through the reset line 24, and during the period when the data-deletion transistor SW2 is selected, the potential at the gate of the current control transistor DR is maintained at Vsub, and the potential of the source-drain of the current control transistor DR is at 0 volts, changing the status of the current control transistor DR to "off". As a result, currents are not supplied to the organic EL element 32, putting the organic EL element 32 to no-light-emission status. In the circuitry composition shown in FIG. 3, the source of the current control transistor DR, which is a p-channel type transistor, is connected to the node 28, and the voltage Vsub is provided. This stabilizes the source potential of the transistor.

Figure 4:
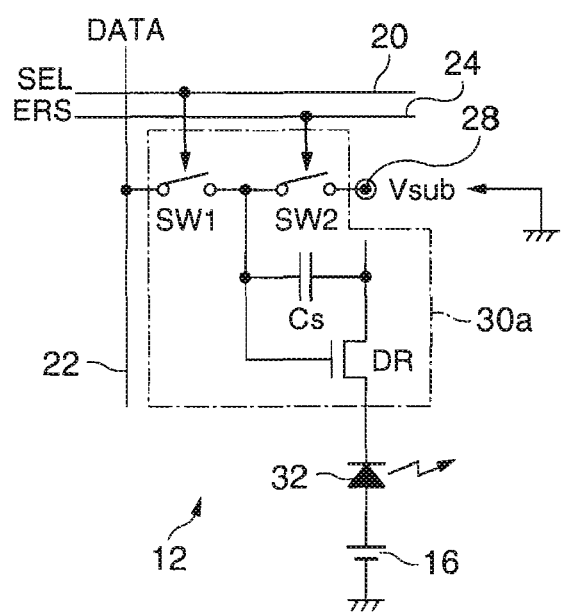
FIG. 4 is a drawing describing another example of the circuitry composition of the organic EL device.

FIG. 4 is a drawing describing another example of the circuitry composition of the organic EL device. Here, the same sings and numerals are used for components that are used in common with the circuit shown in FIG. 3 described above. Hence, the detailed description is omitted. Since a pixel circuit 30a in this embodiment is formed including an n-channel type transistor, the pixel circuit 30a, the organic EL element 32, the power source 16, and the ground are connected differently from the circuit shown in FIG. 3. As shown in the figure, the pixel circuit 30a is connected to the common ground through each of the node 28. The node 28 is electrically connected to the conductive substrate 10 described above. That is to say, the substrate 10 functions as a part of the power supply channel. Further, the voltage Vsub is supplied from the power source 16 to one terminal of the organic EL element 32. The pixel 12 described above is formed including the pixel circuit 30a and the organic EL elements 32.

Thereafter, the structure of the organic EL device is described with reference to sectional drawings.

Figure 5:
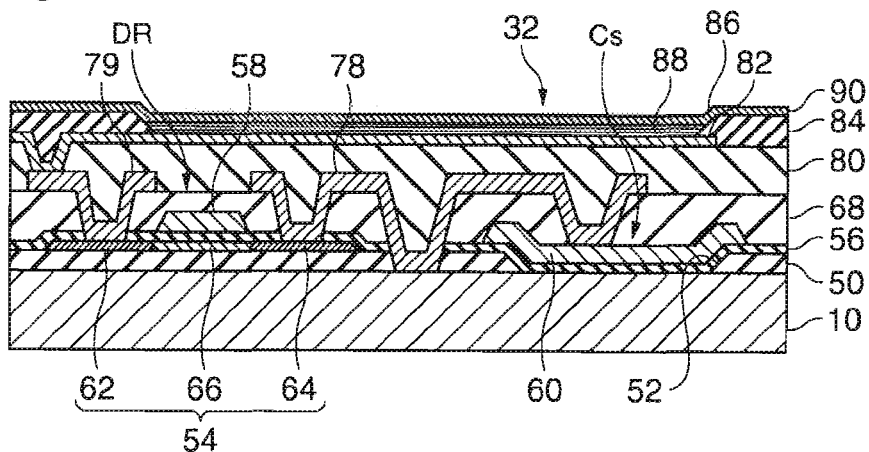
FIG. 5 is a sectional drawing describing a structure of the organic EL device.
Figure 6:
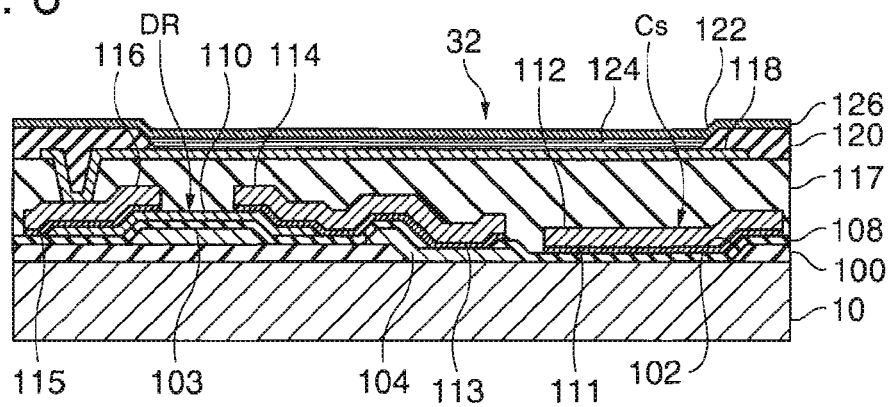
FIG. 6 is a sectional drawing describing another structure of the organic EL device.
Figure 7:
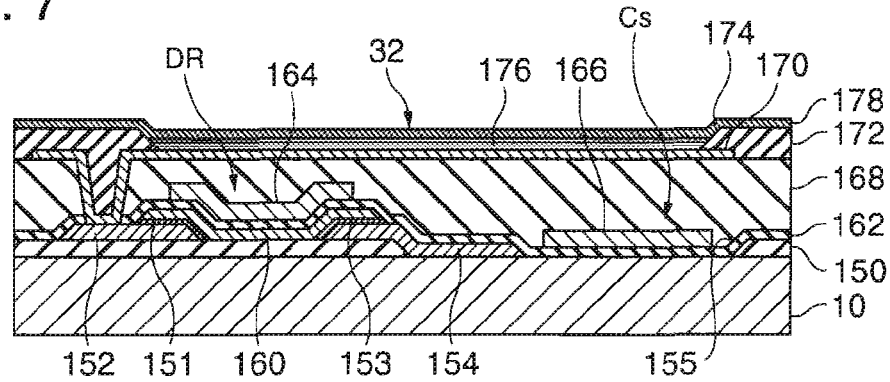
FIG. 7 is a sectional drawing describing still another structure of the organic EL device.

FIGS. 5 to 7 are sectional drawings describing the structures of the organic EL device. The example of the structure of the organic EL device employing coplanar transistors is shown in FIG. 5. The example of the structure of the organic EL device employing inverted staggered transistors is shown in FIG. 6. The example of the structure of the organic EL device employing staggered transistors is shown in FIG. 7.

The organic EL device shown as an example in FIG. 5 includes circuit components such as the storage capacitor Cs and the current control transistors DR that form the pixel circuits 30 or 30a, installed on one side of the conductive substrate 10; and the organic EL elements 32 installed thereon. Here, the data write-in transistor SW1 and the data-deletion transistor SW2 are not illustrated for convenience of explanation. The structure of the organic EL device will now be described in further detail.

A first insulation film 50 is formed on one side of the substrate 10, and has an aperture 52 that partially exposes this side of the substrate 10. Examples of the first insulation film 50 include insulation films such as an silicon oxide (SiOx) film, a silicon nitride (SiN) film, a silicon oxide nitride (SiON) film, and ceramic thin film.

A semiconductor film 54 is formed at the prescribed location on the first insulation film 50 so as to cover the part of the first insulation film 50. Examples of the semiconductor film 54 include generally known semiconductor films such as amorphous silicon film, polysilicon film, single-crystal silicon film, oxide semiconductive film, and organic semiconductive film. This semiconductor film 54 includes a channel-forming region 66, and source-drain regions 62 and 64 arranged on both sides of the channel-forming region 66.

A second insulation film 56 is formed on the first insulation film 50 so as to cover the semiconductor film 54. The second insulation film 56 contacts one side of the substrate 10 via the aperture 52 formed in the first insulation film 50. In the example shown in the figure, the second insulation film 56 covers the aperture 52, and buried inside the aperture 52. The second insulation film. 56 may include at least one of an oxide silicon ($SiO_2$) film, a silicon nitride (SiN) film, a silicon oxide nitride (SiON) film, an aluminum oxide ($Al_2O_3$) film, and a hafnium oxide (HfO) film.

Hereafter, the relationship between the first insulation film 50 and the second insulation film 56 is described hereafter. The film thickness of the second insulation film 56 is preferably smaller than that of the first insulation film 50. For instance, the thickness of the first insulation film 50 ranges approximately from 200 nm to 500 nm, and the thickness of the second insulation film 56 ranges approximately from 50 nm to 100 nm. The permittivity (relative permittivity) of the second insulation film 56 is desirably larger than that of the first insulation film 50. In other words, the so-called high-k material is desirable for the second insulation film 56, and the so-called low-k material is desirable for the first insulation film 50. From this point of view materials such as silicon oxide (SiOx), and boro-silicate glass (BSG) are particularly preferable for the first insulation film 50. Moreover, materials such as aluminum oxide ($Al_2O_3$), hafnium oxide (HfO), tantalum oxide ($Ta_2O_5$) and zirconium oxide ($XrO_2$) are particularly preferable for the second insulation film 56.

A gate electrode 58 is formed on the semiconductor film 54, sandwiching the second insulation film 56. In the example shown in the figure, the gate electrode 58 lies almost directly on the channel-forming region 66 of the semiconductor film 54. This gate electrode 58 is obtained by depositing a conductive film (for instance, aluminum film) on the second insulation film 56, and thereafter patterning the conductive film. The current control transistor DR is formed including the gate electrode 58, the semiconductor film 54, and a part of the second insulation film 56 (a part sandwiched by the gate electrode 58 and the semiconductor film 54).

A capacitor electrode 60 is formed on the aperture 52, facing the substrate 10 across the second insulation film 56. This capacitor electrode 60 is obtained by depositing a conductive film such as aluminum film on the second insulation film 56, and thereafter patterning the conductive film. The storage capacitor Cs is formed including this capacitor electrode 60, the substrate 10, and a part of the second insulation film 56 (a part sandwiched by the capacitor electrode 60 and the substrate 10).

A first intermediate insulation film 68 is formed on the substrate 10, covering the second insulation film 56, the gate electrode 58, and the capacitor electrode 60. Examples of first intermediate insulation film 68 include: insulation films such as the one composed with a material similar to that of the first insulation film 50 described above; a silicon oxide (spin-on-glass) film formed by coating; and organic insulation films composed with materials such as polymide or acryl.

A wiring 78 and a wiring 79 form the pixel circuits, the scanning lines, and the signal lines described above. These wirings 78 and 79 are obtained by depositing a conductive film such as aluminum film on the first intermediate insulation film 68, and thereafter patterning the conductive film. The wiring 78 is electrically connected to the substrate 10 via an aperture that goes through the first insulation film 50, the second insulation film 56 and the first intermediate insulation film 68. Moreover, the wiring 78 is electrically connected to the source-drain region 64 via an aperture that goes through the second insulation film 56 and the first intermediate insulation film 68, as well as to the capacitor electrode 60 via an aperture that goes through the first intermediate insulation film 68. This allows an electrical connection between the substrate 10 and the pixel circuit formed including the thin film transistor and the capacitive element. More specifically, if the thin film transistor is a p-channel type, then the source of this thin film transistor and the substrate 10 are connected through the wiring 78. If the thin film transistor is an n-channel type, then the drain of this thin film transistor and the substrate 10 are connected through the wiring 78. The wiring 79 is electrically connected to the source-drain region 62 via an aperture that goes through the second insulation film 56 and the first intermediate insulation film 68.

A second intermediate insulation film 80 is formed on the substrate 10 (the first intermediate insulation film 68), covering the wirings 78 and 79. An insulation film composed with a material similar to that of the above-described first intermediate insulation film 68 can be used for the second intermediate insulation film 80.

A pixel electrode (discrete electrode) 82 is formed at the prescribed location on the second intermediate insulation film 80. Moreover, the pixel electrode 82 is electrically connected to the wiring 79 via an aperture formed in the second intermediate insulation film 80. What is called the top emission type of organic EL devices is envisioned in the embodiments. Hence, in order to achieve a larger aperture ratio, the pixel electrode 82 is formed in a location different from the thin film transistor and the capacitive element, shifting in the top-down direction. The pixel electrode 82 is obtained by depositing a conductive film such as aluminum film on the second intermediate insulation film 80, and thereafter patterning the conductive film.

Barrier ribs 84 are formed on the second intermediate insulation film 80 and have an aperture 86 that exposes the pixel electrode 82. These barrier ribs 84 are obtained by depositing a resin film such as polymide or acryl film on the second intermediate insulation film 80, and thereafter patterning the resin film.

A light-emitting layer 88 is formed on the pixel electrode 82, inside the aperture 86 of the barrier ribs 84. The light-emitting layer 88 may be formed using either a small molecule material or a polymeric material. Various functional layers may also be deposited on the light-emitting layer 88, where examples of the various functional layers include an electron emission layer, an electron transport layer, a hole injecting layer, and a hole transport layer.

A common electrode 90 is formed on the barrier ribs 84, covering the light-emitting layer 88. The top emission structure is employed in the organic EL device according to the embodiments. Hence, the common electrode 90 is formed using a transparent or translucent conductive film, so that the light-emission from the light-emitting layer 88 can be extracted from the top (directed away from the substrate 10) in the figure. An example of such conductive film includes an indium tin oxide (hereafter "ITO"). The organic EL element 32 is formed including this common electrode 90, the pixel electrode 82 and the light-emitting layer 88 described above. If the thin film transistor DR is a p-channel type, then the organic EL element 32 is connected: to the drain of the thin film transistor DR through the wiring 79 at the pixel electrode 82 which serves as one terminal of the organic EL elements 32; and to the common ground (not illustrated) at the common electrode 90 which serves as the other terminal thereof If the thin film transistor DR is an n-channel type, then the organic EL element 32 is connected: to the source of the thin film transistor DR through the wiring 79 at the pixel electrode 82 which serves as one terminal of the organic EL elements 32; and to the power source 16 (not illustrated) at the common electrode 90 which serves as the other terminal thereof.

The organic EL device shown as an example in FIG. 6 employs inverted staggered transistor as the current control transistor DR, and the structure thereof will now be described in detail. Here, the data write-in transistor SW1 and the data-deletion transistor SW2 are not illustrated for convenience of explanation.

A first insulation film 100 is formed on one side of the substrate 10, and has an aperture 102 that partially exposes this side of the substrate 10. This first insulation film 100 is composed with an insulation film similar to the first insulation film 50 described above.

A gate electrode 103 is formed on the first insulation film 100, covering a part thereof. This gate electrode 103 is composed a material similar to that of the gate electrode 58 described above.

A wiring (electrode) 104 is formed, one part inside an aperture 102, and the other part on the first insulation film 100, electrically connecting a wiring 114 (hereafter also referred to as "source-drain electrode 114") and the substrate 10. This wiring 104 is composed with a material similar to that of the gate electrode 58 described above.

A second insulation film 108 is formed on the first insulation film 100, covering the gate electrode 103 and the wiring 104. Moreover, the second insulation film 108 contacts one side of the substrate 10 via the aperture 102. A part of the second insulation film 108 that corresponds to the gate electrode 103 functions later as the gate insulation film of the thin film transistor. Another part thereof that corresponds to an capacitor electrode 112 functions as a dielectric layer, serving as a component of capacitive element. This second insulation film 108 is composed with a material similar to that of the second insulation film 56 described above.

The same suitable conditions of film thickness and permittivity as those in the above-described first insulation film 50 and the second insulation film 56 also apply for the first insulation film 100 and the second insulation film 108 in the organic EL device according to this embodiment.

A semiconductor film 110 is formed so as to cover the gate electrode 103, sandwiching the second insulation film 108. This semiconductor film 110 becomes an active layer of the thin film transistor (a channel forming region). The semiconductor film 110 is composed with a material similar to that of the semiconductor film 54 described above.

The capacitor electrode 112 is formed on the aperture 102, facing the substrate 10 across the second insulation film 108. This capacitor electrode 112 is composed with a material similar to that of the gate electrode 58 described above. In the example shown in the figure, by providing a doped semiconductor film 111 between the electrode 112 and the second insulation film 108, a preferable ohmic contact of both is assured. The storage capacitor Cs is formed including this capacitor electrode 112, the substrate 10, and a part of the second insulation film 108 (a part sandwiched by the capacitor electrode 112 and the substrate 10).

The source-drain electrode 114 is formed on the second insulation film 108, one part contacting the semiconductor film 110, and the other part contacting the wiring 104. A source-drain electrode 116 is formed on the second insulation film 108, one part contacting the semiconductor film 110, and the other part on the second insulation film 108. These source-drain electrodes 114 and 116 are composed with a material similar to that of the capacitor electrode 112 described above. In the example shown in the figure, by providing a doped semiconductor film 113 respectively between the wiring 114 and the semiconductor film 110, as well as between the source-drain 114 and the wiring 104, a preferable ohmic contact of each is assured. Similarly, by providing a doped semiconductor film 115 between the source-drain electrode 116 and the semiconductor film 110, a preferable ohmic contact of both is assured.

An intermediate insulation film 117 is formed on the substrate 10 (the second insulation film 108), covering the source-drain electrode 114 and 116. This intermediate insulation film 117 is composed with a material similar to that of the first intermediate insulation film 68.

A pixel electrode 118 is formed at the prescribed location on the intermediate insulation film 117. Moreover, the pixel electrode 118 is electrically connected to the source-drain electrode 116 via an aperture formed in the intermediate insulation film 117. What is called the top emission type of organic EL devices is envisioned in these embodiments. Hence, in order to achieve a larger aperture ratio, the pixel electrode 118 is formed in a location different from the thin film transistor and the capacitive element, shifting in the top-down direction. The pixel electrode 118 is obtained by depositing a conductive film such as aluminum film on the intermediate insulation film 117, and thereafter patterning the conductive film.

Barrier ribs 120 are formed on the intermediate insulation film 117 and have an aperture 122 that exposes the pixel electrode 118. These barrier ribs 120 are composed with a material similar to that of the barrier ribs 84 described above.

A light-emitting layer 124 is formed on the pixel electrode 118, inside the aperture 122 of the barrier ribs 120. These barrier ribs 124 are composed with a material similar to that of the light-emitting layer 88 described above.

A common electrode 126 is formed on the barrier ribs 120, covering the light-emitting layer 124. The top emission structure is employed in the organic EL device according to the embodiments. Hence, the common electrode 126 is formed using a transparent or translucent conductive film, so that the light-emission from the light-emitting layer 124 can be extracted from the top (directed away from the substrate 10) in the figure. The common electrode 126 is composed with a material similar to that of the common electrode 90 described above. The organic EL element 32 is formed including this common electrode 126, the pixel electrode 118 and the light-emitting layer 124 described above. If the thin film transistor DR is a p-channel type, then the organic EL element 32 is connected: to the drain of the thin film transistor DR through the source-drain electrode 116 at the pixel electrode 118 which serves as one terminal of the organic EL elements 32; and to the common ground (not illustrated) at the common electrode 126 which serves as the other terminal thereof. If the thin film transistor DR is an n-channel type, then the organic EL element 32 is connected: to the source of the thin film transistor DR through the source-drain electrode 116 at the pixel electrode 118 which serves as one terminal of the organic EL elements 32; and to the power source 16 (not illustrated) at the common electrode 126 which serves as the other terminal thereof.

The organic EL device shown as an example in FIG. 7 employs a staggered transistor as the current control transistor DR, and the structure thereof will now be described in detail. Here, the data write-in transistor SW1 and the data-deletion transistor SW2 are not illustrated for convenience of explanation.

A first insulation film 150 is formed on one side of the substrate 10, and has an aperture 155 that partially exposes this side of the substrate 10. This first insulation film 150 is composed with a material similar to that of the first insulation film 50 described above.

A source-drain electrode 152 is formed on the first insulation film 150, one part contacting the semiconductor film 160, and the other part on the first insulation film 150. The source-drain electrode 154 (hereinafter also referred to as "wiring 154") is formed on the first insulation film 150, one part contacting the semiconductor film 160, and the other part contacting one side of the substrate 10. These source-drain electrodes 152 and 154 are composed with a material such as the one used in the capacitor electrode 112 described above in the example shown in the figure, by providing a doped semiconductor film 151 between the source-drain electrode 152 and the semiconductor film 160, a preferable ohmic contact of both is assured. Similarly, by providing a doped semiconductor film 153 between the source-drain electrode 154 and the semiconductor film 160, a preferable ohmic contact of both is assured.

The semiconductor film 160 is formed on the first insulation film 150, bridging the source-drain electrodes 152 and 154. This semiconductor film 160 becomes an active layer of the thin film transistor (a channel forming region). The semiconductor film 160 is composed with a material similar to that of the semiconductor film 54 described above.

A second insulation film 162 is formed on the first insulation film 100, covering the source-drain electrodes 152 and 154, as well as the semiconductor film 160. Moreover, the second insulation film 162 contacts one side of the substrate 10 via the aperture 155. A part of the second insulation film 162 that corresponds to a gate electrode 164 functions later as the gate insulation film of the thin film transistor. Another part thereof that corresponds to an capacitor electrode 166 functions as a dielectric layer, serving as a component of capacitive element. This second insulation film 162 is composed with a material similar to that of the second insulation film 56 described above.

The same suitable conditions of film thickness and permittivity as those in the above-described first insulation film 50 and the second insulation film 56 also apply for the first insulation film 150 and the second insulation film 162 in the organic EL device according to this embodiment.

The gate electrode 164 is formed on the semiconductor film 160, sandwiching the second insulation film 162. This gate electrode 164 is composed with a material such as the one used in the gate electrode 58 described above. The current control transistor DR is formed including the gate electrode 164, the semiconductor film 160, and a part of the second insulation film 162 (a part sandwiched by the gate electrode 164 and the semiconductor film 160).

The capacitor electrode 166 is formed on the aperture 155, facing the substrate 10 across the second insulation film 162. This capacitor electrode 166 is composed with a material such as the one used in the gate electrode 58 described above. The storage capacitor Cs is formed including this capacitor electrode 166, the substrate 10, and a part of the second insulation film 162 (a part sandwiched by the capacitor electrode 166 and the substrate 10).

An intermediate insulation film 168 is formed on the substrate 10 (the second insulation film 162), covering the gate electrode 164 and the capacitor electrode 166. This intermediate insulation film 168 is composed with a material such as the one used in the first intermediate insulation film 68 described above.

A pixel electrode 170 is formed at the prescribed location on the intermediate insulation film 168. Moreover, the pixel electrode 170 is electrically connected to the source-drain electrode 152 via an aperture formed in the intermediate insulation film 168. What is called the top emission type of organic EL devices is envisioned in the embodiments. Hence, in order to achieve a larger aperture ratio, the pixel electrode 170 is formed in a location different from the thin film transistor and the capacitive element, shifting in the top-down direction. The pixel electrode 170 is obtained by depositing a conductive film such as aluminum film on the intermediate insulation film 168, and thereafter patterning the conductive film.

Barrier ribs 172 are formed on the intermediate insulation film 168 and have an aperture 174 that exposes the pixel electrode 170. These barrier ribs 172 are composed with a material such as the one used in the barrier ribs 84 described above.

A light-emitting layer 176 is formed on the pixel electrode 170, inside the aperture 174 of the barrier ribs 172. This light-emitting layer 176 is composed with a material similar to that of the light-emitting layer 88 described above.

A common electrode 178 is formed on the barrier ribs 172, covering the light-emitting layer 176. The top emission structure is employed in the organic EL device according to the embodiments. Hence, the common electrode 178 is formed using a transparent or translucent conductive film, so that the light-emission from the light-emitting layer 176 can be extracted from the top (directed away from the substrate 10) in the figure. The common electrode 178 is composed with a material similar to that of the common electrode 90 described above. The organic EL element 32 is formed including this common electrode 178, the pixel electrode 170, and the light-emitting layer 176 described above. If the thin film transistor DR is a p-channel type, then the organic EL element 32 is connected: to the drain of the thin film transistor DR through the source-drain electrode 152 at the pixel electrode 170 which serves as one terminal of the organic EL elements 32; and to the common ground (not illustrated) at the common electrode 178 which serves as the other terminal thereof. If the thin film transistor DR is an n-channel type, then the organic EL element 32 is connected: to the source of the thin film transistor DR through the source-drain electrode 152 at the pixel electrode 170 which serves as one terminal of the organic EL elements 32; and to the power source 16 (not illustrated) at the common electrode 178 which serves as the other terminal thereof.

The organic EL device according to the embodiments has above-referenced structure, and manufacturing methods thereof will now be described in detail.

FIGS. 8A to 10C are process drawings indicated in cross-section, describing an example for the manufacturing method of the organic EL device. In this embodiment, a case in which the pixel circuit is formed using the coplanar transistors (refer to FIG. 5) will be explained.

Figure 8A:
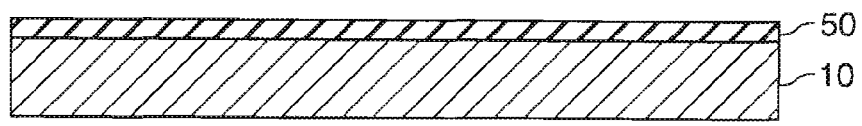
FIG. 8A to 8D are process drawings indicated in cross-section, describing an example for a manufacturing method of the organic EL device.

First, the first insulation film 50 is formed on one side of the conductive substrate 10 (FIG. 8A). The first insulation film 50 may include at least one of an silicon oxide (SiOx) film, a silicon nitride (SiN) film, a silicon oxide nitride (SiON) film, and a ceramic thin film. Known methods can be arbitrarily selected for a method for forming the first insulation film 50. The chemical vapor deposition (CVD) and sputtering are cited as an example. Another method for obtaining the first insulation film 50 may include utilization of the insulation film obtained by annealing the conductive substrate 10 with oxidizing atmosphere, or by anodizing treatment. Particularly in the case of employing a stainless substrate as the substrate 10, a chromium oxide passivation film formed on the substrate surface may preferably utilized.

Figure 8B:
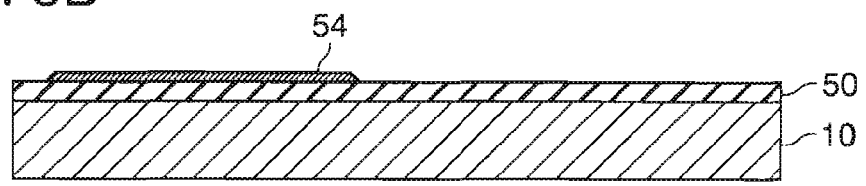

Thereafter, the semiconductor film 54 patterned in a prescribed shape (for instance, in island-shape) is formed (FIG. 8B). The semiconductor film 54 may be a semiconductor film made of a material such as amorphous silicon, polysilicon, single-crystal silicon, oxide semiconductor material, and organic semiconductor material. Known methods can be arbitrarily selected for a method for forming the semiconductor film 54. The chemical vapor deposition (CVD), sputtering, and coating are cited as an example. In this embodiment, the semiconductor film 54 is formed using polysilicon film as an example.

Figure 8C:
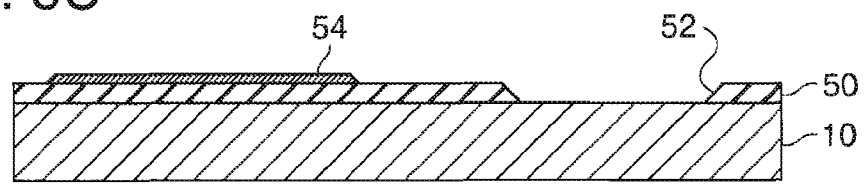

Thereafter, the aperture 52 (an aperture) is formed at the prescribed location on the substrate 10. In FIG. 8C, it is a location adjacent to the semiconductor film 54, More specifically, the first insulation film 50 is removed so that the aperture 52 reaches the substrate 10, exposing one side thereof.

Figure 8D:
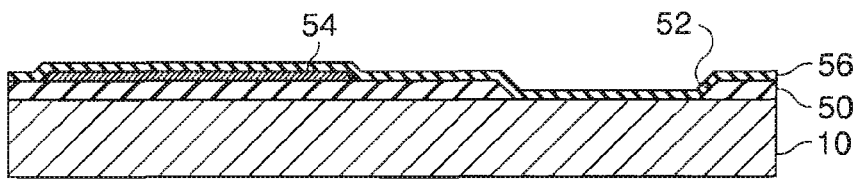

The second insulation film 56 covering the semiconductor film 54 is then formed on the substrate 10 (FIG. 8D). This second insulation film 56 is formed so as to contact one side of the substrate 10 via the aperture 52 formed in the first insulation film 50. In the shown example, the second insulation film 56 covers the aperture 52, and buried inside the aperture 52. The second insulation film 56 may include at least one of an oxide silicon ($SiO_2$) film, a silicon nitride (SiN) film, a silicon oxide nitride film (SiON) film, an aluminum oxide ($Al_2O_3$) film, and a hafnium oxide (HfO) film.

Figure 9A:
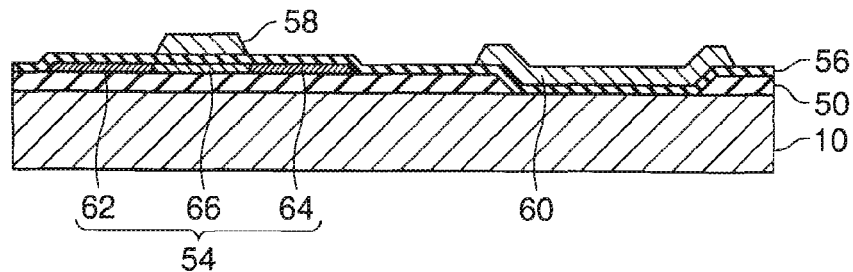
FIG. 9A to 9D are process drawings indicated in cross-section, describing an example for the manufacturing method of the organic EL device.

Thereafter, the gate electrode 58 and the capacitor electrode 60 are formed (FIG. 9A). Other un-illustrated electrodes and wirings are formed in conjunction with this step. These electrodes and wirings form the above-described components such as pixel circuits, scanning lines, and signal lines. The gate electrode 58 and the capacitor electrode 60 are obtained by depositing a conductive film such as an aluminum film on the second insulation film 56, and thereafter patterning the conductive film. After forming the gate electrode 58 and the capacitor electrode 60, an ion implantation is carried out to the semiconductor film 54, using the gate electrode 58 as a mask, which is what is called a self-aligning ion implantation. As a result, a self-aligning source-drain region is formed in the semiconductor film 54. Specifically, a channel-forming region 66 is formed directly under the gate electrode 58 of the semiconductor film 54, and source-drain regions 62 and 64 are formed on opposite sides of the channel-forming region 66. Consequently, the coplanar thin film transistor is completed, as shown in the figure. This thin film transistor functions as a current control transistor DR (refer to FIG. 4) described above. Similarly, other un-illustrated thin film transistors are formed, each functioning as transistors SW1 to SW4. The capacitor electrode 60, the substrate 10, and the second insulation film 56 sandwiched by the former two, together form a capacitive element. This capacitive element functions as the above-referenced storage capacitor Cs.

The first intermediate insulation film 68 that covers the gate electrode 58 and the capacitor electrode 60 is then formed on the substrate 10 (FIG. 9B), Examples of first intermediate insulation film 68 include insulation films such as the one composed with a material similar to that of the first insulation film 50 described above; a silicon oxide (spin-on-glass) film formed by coating; and organic insulation films composed with materials such as polymide or acryl. It is preferable to employ the SOG film or the organic insulation film, since simple and easy method such as coating can be used.

Figure 9B:
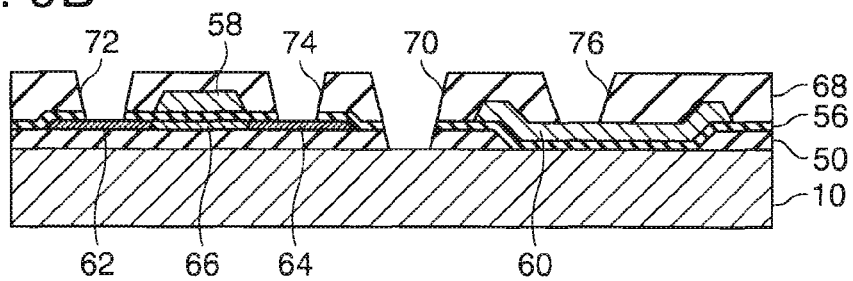

Apertures 70, 72, 74, and 76 are formed at the prescribed locations on the substrate 10 (FIG. 9B). More specifically, the aperture 70 is formed at the location adjacent to the thin film transistor including components such as the gate electrode 58, so that the first insulation film 50, the second insulation film 56, and the first intermediate insulation film 68 are removed and the aperture 70 reaches the substrate 10, exposing one side thereof The aperture 72 reaches the source-drain region 62 by removing the second insulation film 56 and the first intermediate insulation film 68, so that one side of the source-drain region 62 is exposed. The aperture 74 reaches the source-drain region 64 by removing the second insulation film 56 and the first intermediate insulation film 68, so that one side of the source-drain region 64 is exposed. The first insulation film 68 is removed so that the aperture 76 reaches the capacitor electrode 60, exposing one side thereof.

Figure 9C:
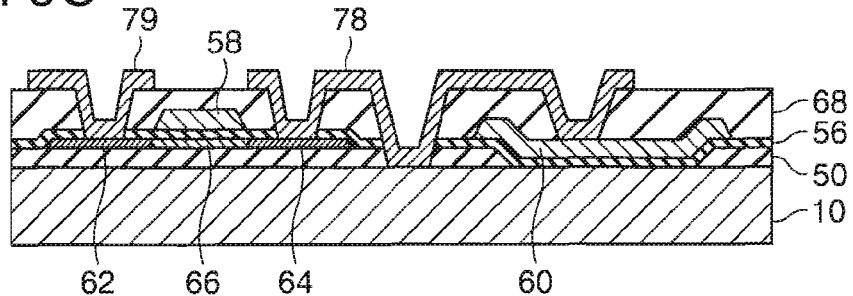

The wirings 78, 79 and other un-illustrated electrode and wirings are then formed (FIG. 9C). These electrodes and wirings form the above-described components such as the pixel circuits, the scanning lines, and the signal lines. These wirings 78 and 79 are obtained by depositing a conductive film such as aluminum film on the first intermediate insulation film 68, and thereafter patterning the conductive film. As shown in the figure, the wiring 78 lies across the apertures 70, 74, and 76, and buried inside those apertures. The wiring 78 is electrically connected: to the substrate 10 via the aperture 70; to the source-drain region 64 via the aperture 74; and to the capacitor electrode 60 via the aperture 76. This allows an electrical connection between the substrate 10 and the pixel circuit formed including the thin film transistor and the capacitive element. More specifically, if the thin film transistor is a p-channel type, then the source of this thin film transistor and the substrate 10 are connected through the wiring 78. If the thin film transistor is an n-channel type, then the drain of this thin film transistor and the substrate 10 are connected through the wiring 78.

As shown in the figure, the wiring 79 is buried in the aperture 72, and electrically connected to the source-drain region 62. Caution must be taken in the case of using the stainless substrate as the substrate 10, since the passivation film is formed on the substrate surface, if the place where the aperture 70 is opened is exposed to the atmosphere. This passivation film may cause a contact failure between the substrate 10 and the wiring 78. Therefore, prior to forming the wiring 78, such passivation film should be removed by carrying out the treatments such as exposing the surface of the substrate 10 to plasma in a vacuumed space.

Figure 9D:
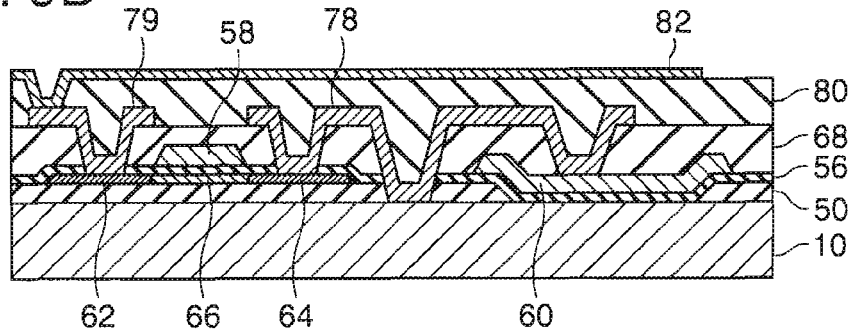

The second intermediate insulation film 80 covering the wirings 78 and 79 are then formed on the substrate 10 (FIG. 9D). The second intermediate insulation film 80 can be formed in a manner similar to the one used in the gate electrode 58. Subsequently, an aperture that exposes part of the wiring 79 is formed. Moreover., the pixel electrode (anode) 82 that is electrically connected to the wiring 79 via this aperture is formed on the second intermediate insulation film 80. The pixel electrode 82 is obtained by depositing a conductive film such as aluminum film on the second intermediate insulation film 80, and thereafter patterning the conductive film.

Subsequently, the barrier ribs 84 having the aperture 86 that exposes the pixel electrode 82 is formed on the second intermediate insulation film 80. These barrier ribs 84 are obtained by depositing a resin film on the second intermediate insulation film 80, and thereafter patterning the resin film. The resin film may include at least one of polymide film and an acryl film.

Figure 10A:
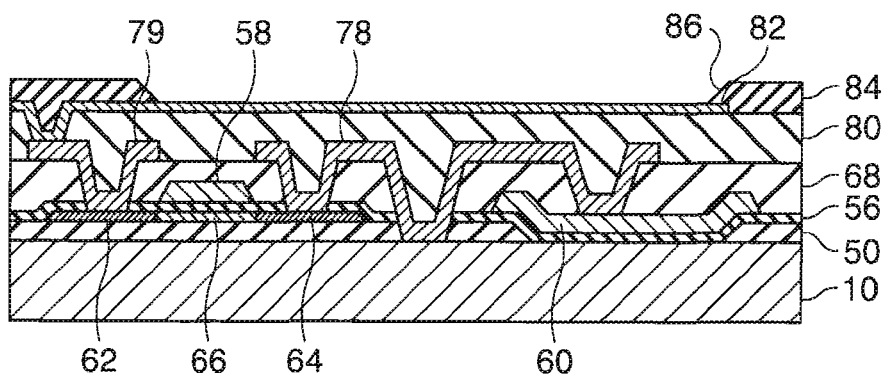
FIG. 10A to 10C are process drawings indicated in cross-section, describing an example for the manufacturing method of the organic EL device.
Figure 10B:
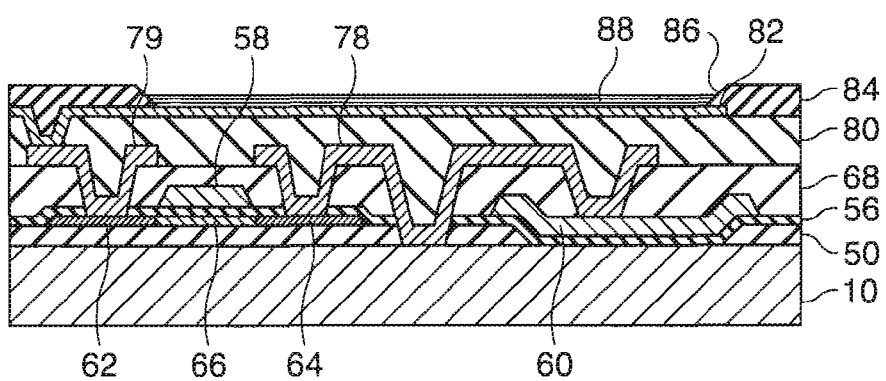

The light-emitting layer 88 is formed on the pixel electrode 82 inside the aperture 86 (FIG. 10B). The light-emitting layer 88 may be formed using either a small molecule material or a polymeric material. Various known techniques such as vapor deposition, coating, liquid discharging (inkjet) may be used as a method for forming the light-emitting layer 88. Various functional layers may also be deposited on the light-emitting layer 88, where examples of the various functional layers include an electron emission layer, an electron transport layer, a hole injecting layer, and a hole transport layer.

Figure 10C:
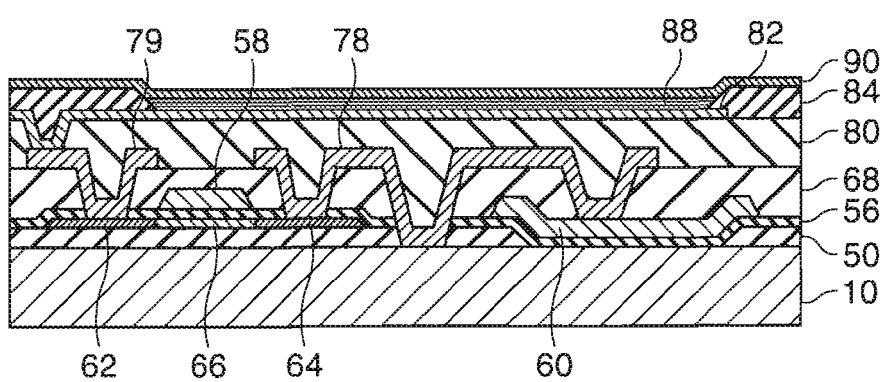

The common electrode 90 (cathode) is formed on the barrier ribs 84, across the plurality of light-emitting layers 88 (FIG. 10C). In this embodiment, the common electrode 90 is formed using the transparent or translucent conductive film. An example of such conductive film includes an indium tin oxide (hereafter "ITO"). The organic EL element formed including the pixel electrode 82, the light-emitting layer 88, and the common electrode 90.

Consequently, the organic EL device shown in FIG. 5 is formed.

As another example of the method for manufacturing the organic EL device according to the embodiments, a case in which the pixel circuit is formed using the inverted staggered transistor (refer to FIG. 6) will now be explained.

FIGS. 11A to 13C are process drawings indicated in cross-section, describing another example for the manufacturing method of the organic EL device.

Figure 11A:
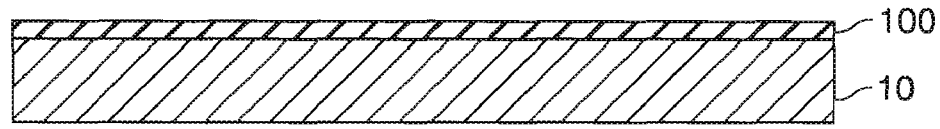
FIG. 11A to 11D are process drawings indicated in cross-section, describing another example for the manufacturing method of the organic EL device.

First, the first insulation film 100 is formed on one side of the conductive substrate 10 (FIG. 11A). This first insulation film 100 is formed in a manner similar to the one used in the first insulation film 50 described above.

Figure 11B:
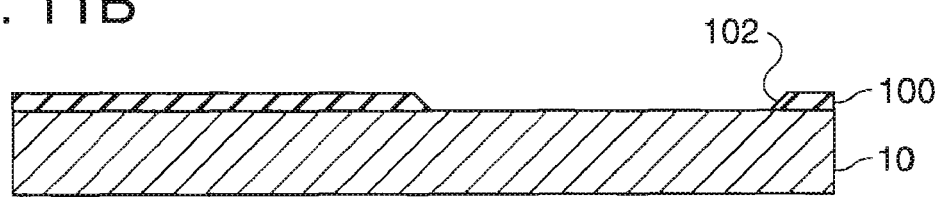

The aperture 102 is then formed at the prescribed location of the first insulation film 100 (FIG. 11B). As shown, this aperture 102 is formed so as to expose one side of the substrate 10.

Figure 11C:
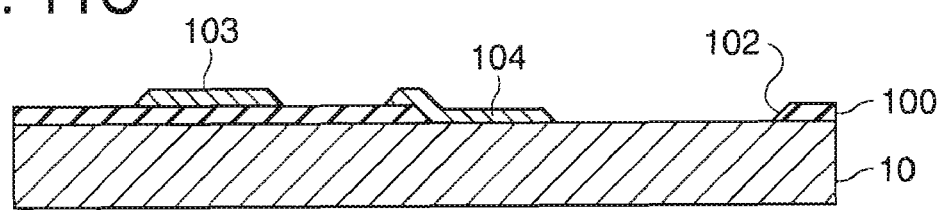

The gate electrode 103 and the wiring 104 are then formed (FIG. 11C). The gate electrode 103 is formed at the prescribed location on the first insulation film 100. Moreover, the wiring 104 is formed so that part of it contacts one side of the substrate 10 in the aperture 102.

Figure 11D:
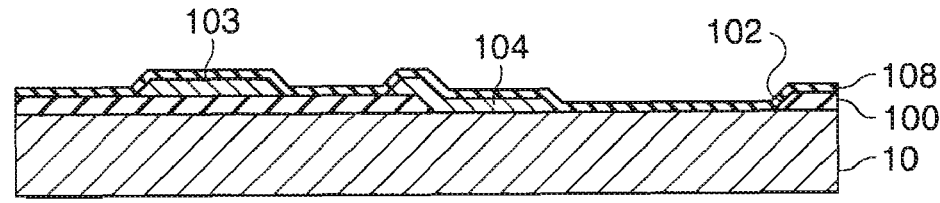

The second insulation film 108 that covers the gate electrode 103 and the wiring 104 is then formed on the substrate 10 (FIG. 11D). This second insulation film 108 is composed in a manner similar to the one used in the second insulation film 56 described above.

Figure 12A:
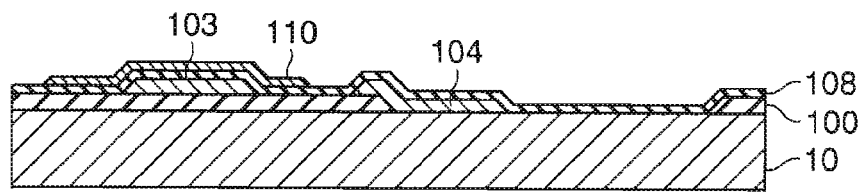
FIG. 12A to 12D are process drawings indicated in cross-section, describing another example for the manufacturing method of the organic EL device.

Thereafter, the semiconductor film 110 patterned into a prescribed shape (for instance, in island-shape) is formed (FIG. 12A). This semiconductor film 110 later becomes the active layer of the thin film transistor (the channel forming region). The semiconductor film 110 is composed in a manner similar to the one used in the semiconductor film 54 described above.

Figure 12B:
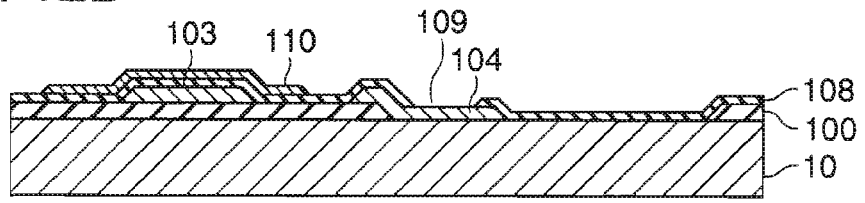

An aperture 109 is then formed at the prescribed location of the substrate 10 (FIG. 12B). More specifically, the aperture 109 is formed at the location adjacent to the thin film transistor including components such as the gate electrode 103, so that the second insulation film 108 is removed and the aperture 109 reaches the wiring 104, exposing one side thereof.

Figure 12C:
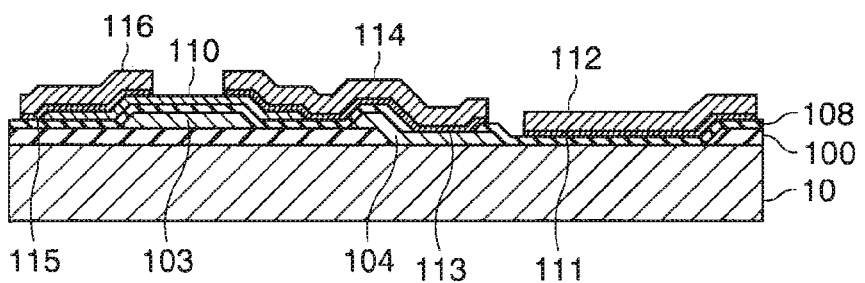

The capacitor electrode 112, the source-drain electrodes 114 and 116 are then formed (FIG. 12C). At this time, the doped semiconductor films 111, 113, and 115 are also formed. More specifically, the doped semiconductor film and the conductive film are deposited one after the other on the second insulation film 108, and those films are patterned into the prescribed shape, and hence the capacitor electrode 112, as well as the source-drain electrodes 114 and 116 are formed. Here, the doped semiconductor film 111 and the capacitor electrode 112 are formed to face the substrate 10, sandwiching the second insulation film 108. The doped semiconductor film 113 and the source-drain electrode 114 are formed so as to bridge the semiconductor film 110 and the wiring 104, and so that the part thereof contacts the wiring 104 via the aperture 109. The doped semiconductor film 115 and the source-drain electrode 116 are formed so as to contact the semiconductor film 110.

Figure 12D:
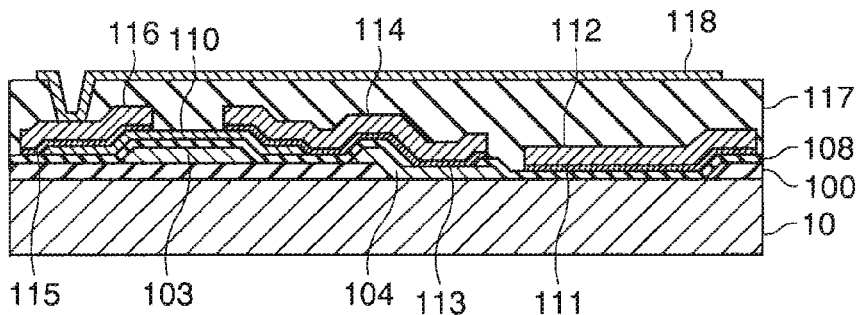

The intermediate insulation film 117 covering the capacitor electrode 112, and the source-drain electrodes 114 and 116 is then formed on the substrate 10 (FIG. 12D). The second intermediate insulation film 117 can be formed in a manner similar to the one used in the second intermediate insulation film 80 described above. Subsequently, an aperture that exposes part of the source-drain electrode 116 is formed. Moreover, the pixel electrode 118 that is electrically connected to the source-drain electrode 116 via this aperture is formed on the second intermediate insulation film 117.

Figure 13A:
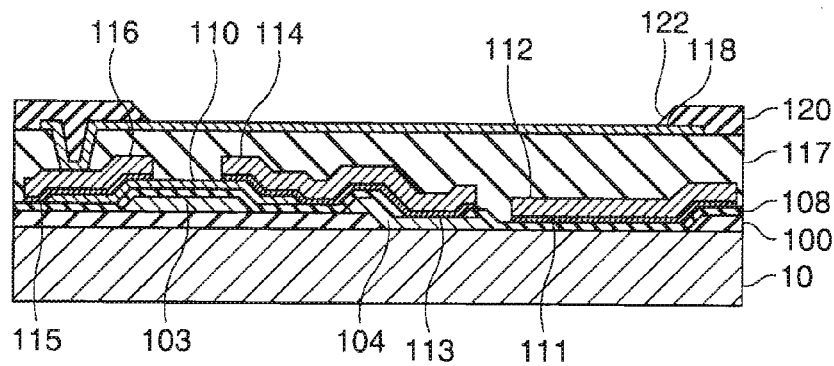
FIG. 13A to 13C are process drawings indicated in cross-section, describing another example for the manufacturing method of the organic EL device.

Thereafter, the barrier ribs 120 having the aperture 122 that exposes the pixel electrode 118 is formed on the intermediate insulation film 117 (FIG. 13A). These barrier ribs 120 can be formed in a manner similar to the one used in the barrier ribs 84 described above.

Figure 13B:
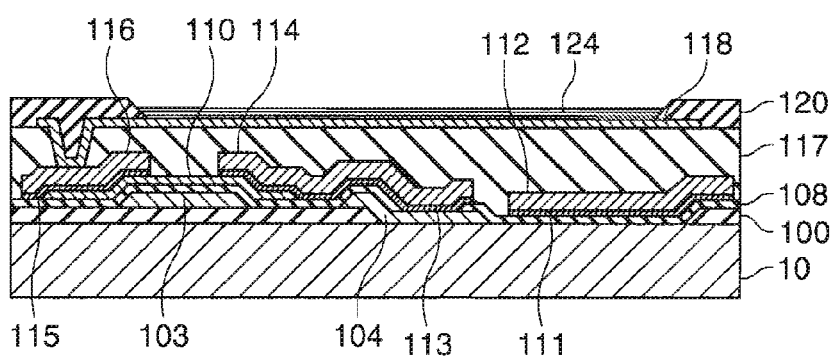

The light-emitting layer 124 is then formed on the pixel electrode 118 inside the aperture 122 (FIG. 13B). This light-emitting layer 124 can be formed in a manner similar to the one used in the light-emitting layer 88 described above.

Figure 13C:
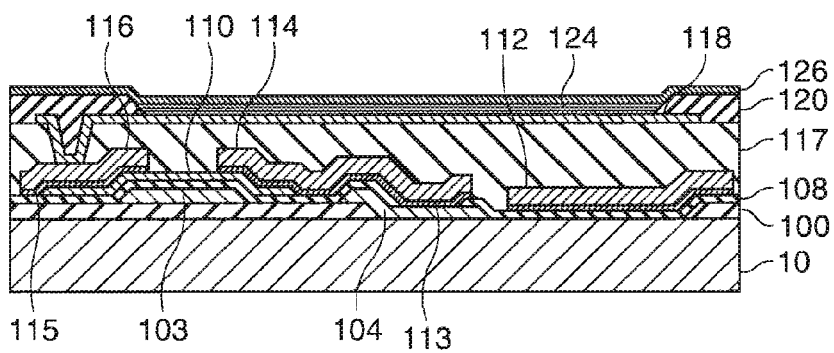

The common electrode 126 is then formed on the barrier ribs 120, across the plurality of light-emitting layers 124 (FIG. 13C). This common electrode 126 can be formed in a manner similar to the one used in the common electrode 90 described above.

Consequently, the organic EL device shown in FIG. 6 is formed.

As a still another example of the method for manufacturing the organic EL device according to the embodiments, a case in which the pixel circuit is formed using the staggered transistor (refer to FIG. 7) will now be explained.

FIGS. 14A to 16D are process drawings indicated in cross-section, describing still another example for the manufacturing method of the organic EL device.

Figure 14A:
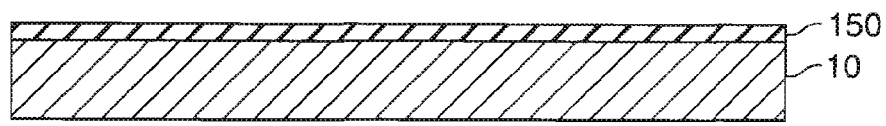
FIG. 14A to 14D are process drawings indicated in cross-section, describing still another example for the manufacturing method of the organic EL device.

The first insulation film 150 is formed on one side of the conductive substrate 10 (FIG. 14A). This first insulation film 150 is formed in a manner similar to the one used in the first insulation film 50 described above.

Figure 14B:
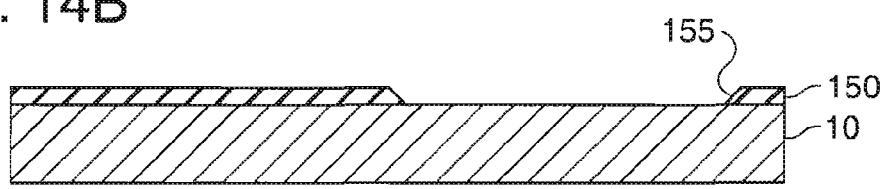

The aperture 155 is then formed at the prescribed location of the first insulation film 150 (FIG. 14B). As shown, this aperture 155 is formed so as to expose one side of the substrate 10.

Figure 14C:
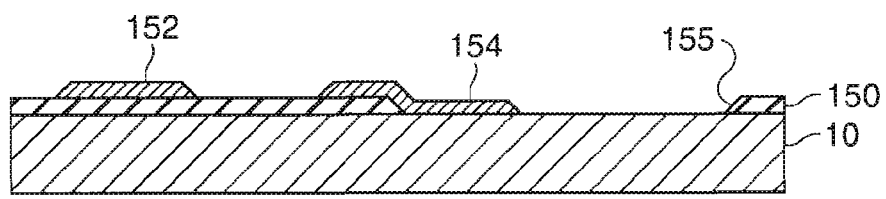

The source-drain electrodes 152 and 154 are then formed (FIG. 14C). The wiring 154 is formed so that part thereof contacts one side of the substrate 10 via the aperture 155.

Figure 14D:
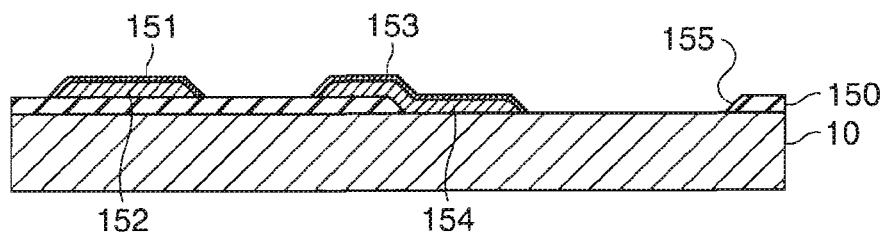

The doped semiconductor films 151 and 153 are formed, covering the source-drain electrodes 152 and 154 respectively (FIG. 14D). More specifically, the doped semiconductor films 151 and 153 are obtained by depositing semiconductor films on the substrate 10 using methods such as CVD or sputtering, thereafter patterning the semiconductor films in accordance with the shapes of the source-drain electrodes 152 and 154. Alternatively, the doped semiconductor films 151 and 153 are formed by coating the surfaces of the source-drain electrodes 152 and 154 with a liquid member, using the droplet discharge method.

Figure 15A:
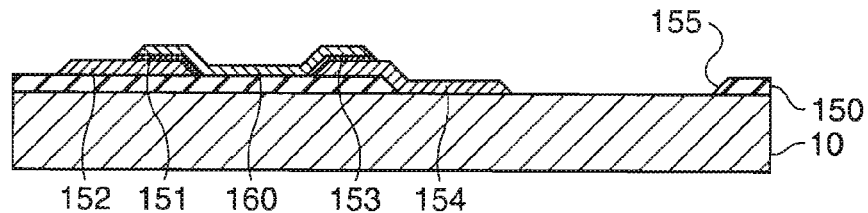
FIG. 15A to 15D are process drawings indicated in cross-section, describing still another example for the manufacturing method of the organic EL device.

Thereafter, the semiconductor film 160 patterned into a prescribed shape (for instance, in island-shape) is formed (FIG. 15A). This semiconductor film 160 later becomes the active layer of the thin film transistor (the channel forming region). The semiconductor film 160 is composed in a manner similar to the one used in the semiconductor film 54 described above. In this embodiment, the semiconductor film 160 is formed bridging the source-drain electrode 152 and the source-drain electrode 154. Parts of the doped semiconductor films 151 and 153 which are covered by the semiconductor film 160 remain, while the rest is removed during the semiconductor film 160 is formed (during patterning). As a result, the doped semiconductor film 151 is provided between the semiconductor film 160 and the source-drain electrode 152, and the doped semiconductor film 153 is provided between the semiconductor film 160 and the source-drain electrode 154.

Figure 15B:
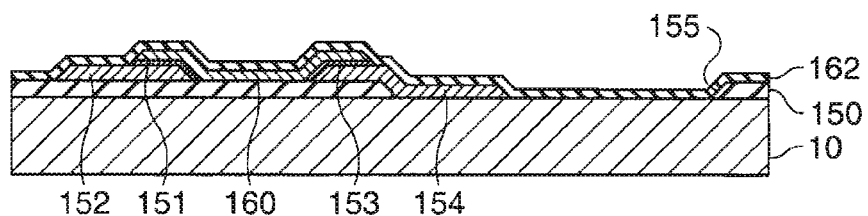

The second intermediate insulation film 162 that covers the source-drain electrodes 152 and 154, and the semiconductor film 160 is then formed on the substrate 10 (FIG. 15B). This second insulation film 162 is composed in a manner similar to the one used in the second insulation film 56 described above.

Figure 15C:
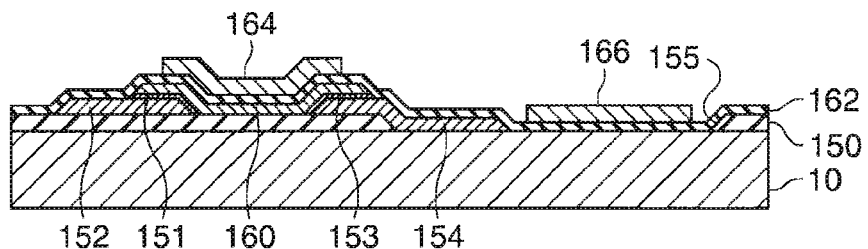

The gate electrode 164 and the capacitor electrode 166 are then formed (FIG. 15C). More specifically, the gate electrode 164 is formed at the location overlapping the semiconductor film 160, sandwiching the second insulation film 162. The capacitor electrode 166 is formed so as to face the substrate 10, sandwiching the second insulation film 162.

Figure 15D:
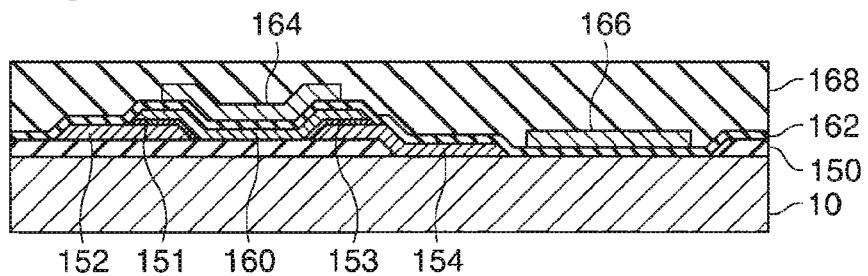

The intermediate insulation film 168 that covers the gate electrode 164 and the capacitor electrode 166 is then formed on the substrate 10 (FIG. 15D). The second intermediate insulation film 168 can be formed in a manner similar to the one used in the second intermediate insulation film 80 described above.

Figure 16A:
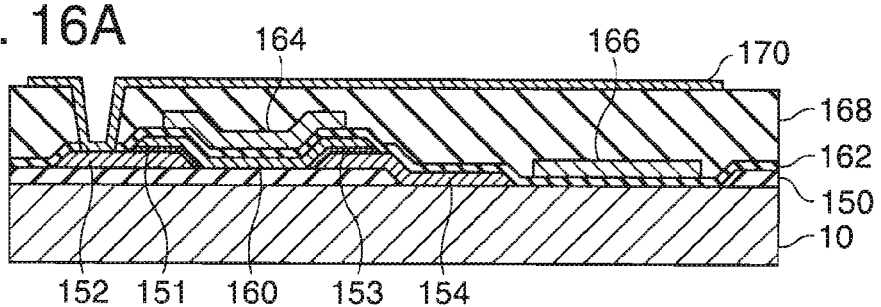
FIG. 16A to 16D are process drawings indicated in cross-section, describing still example for the manufacturing method of the organic EL device.

Subsequently, an aperture that exposes part of the source-drain electrode 152 is formed. Moreover, the pixel electrode 170 that is electrically connected to the source-drain electrode 152 via this aperture is formed on the intermediate insulation film 168 (FIG. 16A).

Figure 16B:
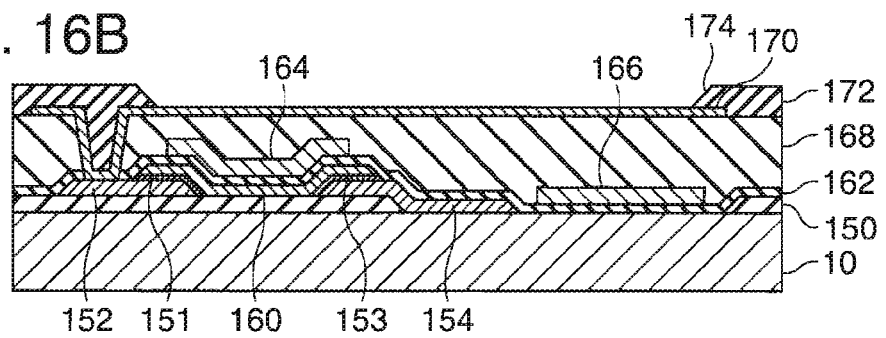

Thereafter, the barrier ribs 172 having the aperture 174 that exposes the pixel electrode 170 is formed on the intermediate insulation film 168 (FIG. 16B). These barrier ribs 172 can be formed in a manner similar to the one used in the barrier ribs 84 described above.

Figure 16C:
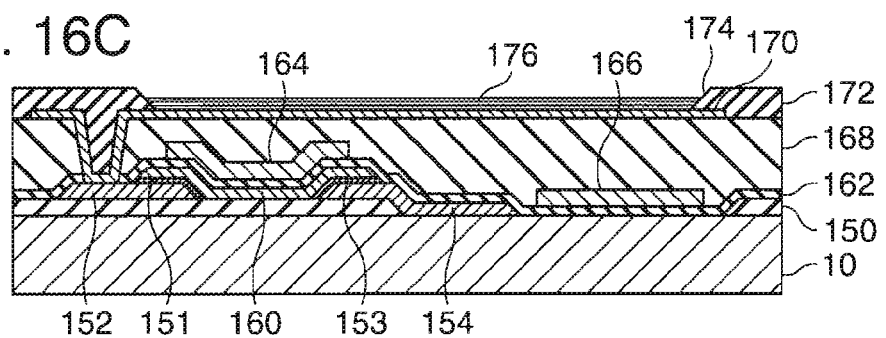
Figure 16D:
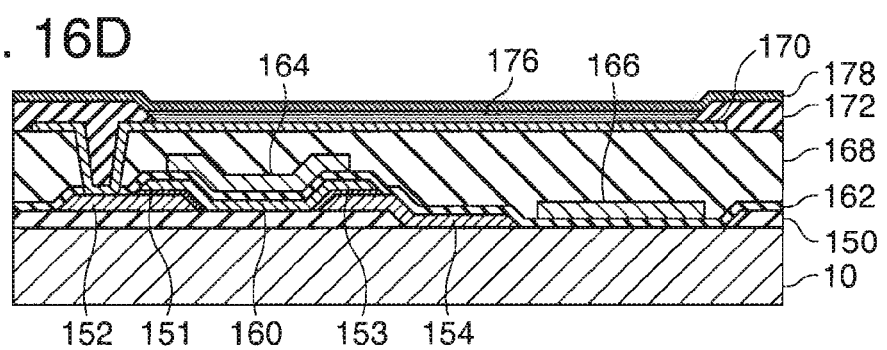

The light-emitting layer 176 is then formed on the pixel electrode 170 inside the aperture 174 (FIG. 16C). This light-emitting layer 176 can be formed in a manner similar to the one used in the light-emitting layer 88 described above.

Figure 17A:
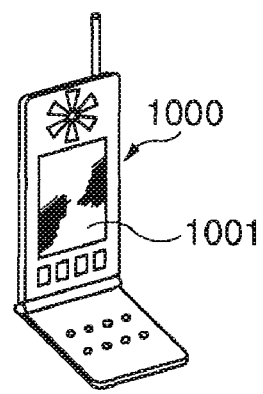
FIG. 17A to 17C are oblique drawings showing illustrative examples of an electronic apparatus.
Figure 17B:
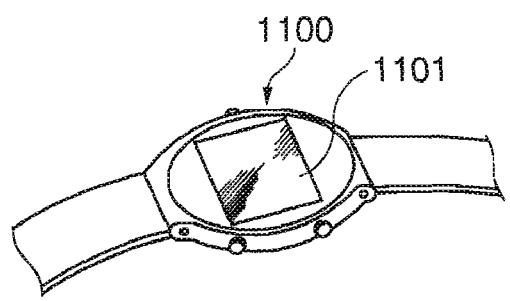
Figure 17C:
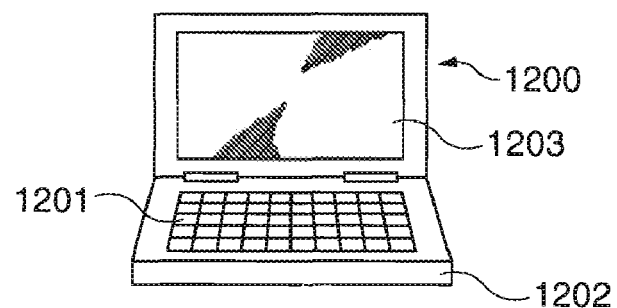

The common electrode 178 is then formed on the barrier ribs 172, across the plurality of light-emitting layers 176 (FIG. 17C). This common electrode 178 can be formed in a manner similar to the one used in the common electrode 90 described above.

Consequently, the organic EL device shown in FIG. 7 is formed.

Illustrative examples of electronic apparatuses including the above-referenced organic EL devices will now be described.

FIGS. 17A to 17C are oblique drawings showing illustrative examples of the electronic apparatus having an organic EL device as a display unit. FIG. 17A is an oblique drawing showing a mobile phone which is an example of the electronic apparatus. A mobile phone 1000 includes a display unit 1001 that uses the organic EL device according to the embodiments. FIG. 17B is an oblique drawing showing a wristwatch which is another example of the electronic apparatus. A wristwatch 1100 includes a display unit 1101 that uses the organic EL device according to the embodiments. FIG. 17C is an oblique drawing showing a mobile information-processing device 1200 which is still another example of the electronic apparatus. This mobile information-processing device 1200 includes: an input unit 1201 such as a keyboard; a body 1202 in which units such as an arithmetic circuit and storage are housed; and a display unit 1203 including the organic EL device according to the embodiments.

As described, according to the embodiments, combining the first insulation film and the second insulation film allows a separation of functions required in insulation films. In other words, conditions such as film thickness or permittivity, suitable for reducing the parasitic capacitance, can be set for the first insulation film, while assuring the insulation between the substrate and the organic electroluminescence elements or the transistors installed on this substrate. Moreover, conditions such as film thickness or permittivity, suitable for increasing an electrostatic capacitance, can be set for the second insulation film, when forming capacitive elements being sandwiched by the conductive substrate and the capacitor electrode. Consequently, the storage capacitance increase of the capacitive elements, and the parasitic capacitance decrease generated between the substrate and the circuit component, are simultaneously obtained.

What is claimed is:

1. An organic electroluminescence device comprising:
    a substrate having conductivity on at least one side;
    a first insulation film, formed on one side of the substrate, while having an aperture which partially exposes the same side of the substrate;
    a semiconductor film, formed on the first insulation film, while covering a part of the first insulation film;
    a second insulation film formed on the first insulation film, while covering the semiconductor film and contacting the same side of the substrate via the aperture;
    a capacitor electrode, formed on the aperture, while sandwiching the second insulation film so as to face the substrate;
    a gate electrode formed on the semiconductor film, so as to sandwich the second insulation film; and
    an organic electroluminescence element, formed on the second insulation film, electrically connected to the semiconductor film.

2. The organic electroluminescence device according to claim 1, wherein a film thickness of the second insulation film is smaller than the film thickness of the first insulation film.

3. The organic electroluminescence device according to claim 1, wherein a permittivity of the second insulation film is larger than the permittivity of the first insulation film.

4. The organic electroluminescence device according to claim 1, wherein the substrate includes a conductive substrate.

5. An electronic apparatus comprising the organic electroluminescence device according to claim 1.

6. An organic electroluminescence device comprising:
    a substrate having conductivity on at least one side;
    a first insulation film, formed on one side of the substrate, while having an aperture which partially exposes the same side of the substrate;
    a gate electrode, formed on the first insulation film, while covering a part of the first insulation film;
    a second insulation film formed on the first insulation film, while covering the gate electrode and contacting the same side of the substrate via the aperture;

a capacitor electrode, formed on the aperture, while sandwiching the second insulation film so as to face the substrate;

a semiconductor film formed on the gate electrode, so as to sandwich the second insulation film; and an organic electroluminescence element, formed on the second insulation film, electrically connected to the semiconductor film.

7. The organic electroluminescence device according to claim 6, wherein a film thickness of the second insulation film is smaller than the film thickness of the first insulation film.

8. The organic electroluminescence device according to claim 6, wherein a permittivity of the second insulation film is larger than the permittivity of the first insulation film.

9. The organic electroluminescence device according to claim 6, wherein the substrate includes a conductive substrate.

10. A method for manufacturing an organic electroluminescence device, comprising:

forming a first insulation film on a side of a conductive substrate;

forming, on the first insulation film, an aperture which partially exposes the side of the substrate;

forming, on the first insulation film, a semiconductor film which covers a part of the first insulation film;

forming, on the first insulation film, a second insulation film covering the semiconductor film and contacting the side of the substrate via the aperture;

forming, on the aperture, a capacitor electrode sandwiching the second insulation film so as to face the substrate;

forming, on the second insulation film, a gate electrode arranged on the semiconductor film while sandwiching the second insulation film; and forming, on the second insulation film, an organic electroluminescence element electrically connected to the semiconductor film.

11. A method for manufacturing an organic electroluminescence device, comprising:

forming a first insulation film on a side of a conductive substrate;

forming, on the first insulation film, an aperture which partially exposes the side of the substrate;

forming, on the first insulation film, a gate electrode which covers a part of the first insulation film;

forming, on the first insulation film, a second insulation film covering the gate electrode and contacting the side of the substrate via the aperture;

forming, on the second insulation film, a semiconductor film arranged on the gate electrode while sandwiching the second insulation film;

forming, on the aperture, a capacitor electrode sandwiching the second insulation film so as to face the substrate; and forming, on the second insulation film, an organic electroluminescence element electrically connected to the semiconductor film.

* * * * *